(12) United States Patent
Krivec et al.

(10) Patent No.: US 12,327,727 B2
(45) Date of Patent: Jun. 10, 2025

(54) CHIP WITH A SILICON CARBIDE SUBSTRATE

(71) Applicant: Infineon Technologies AG, Neubiberg (DE)

(72) Inventors: Stefan Krivec, Villach (AT); Ronny Kern, Villach (AT); Stefan Kramp, Villach (AT); Gregor Langer, Wölfnitz (AT); Hannes Winkler, Villach (AT); Stefan Woehlert, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/240,520

(22) Filed: Aug. 31, 2023

(65) Prior Publication Data

US 2023/0420257 A1    Dec. 28, 2023

Related U.S. Application Data

(63) Continuation of application No. 17/315,943, filed on May 10, 2021, now Pat. No. 11,798,807, which is a
(Continued)

(30) Foreign Application Priority Data

May 28, 2018 (DE) .......................... 102018112721.9

(51) Int. Cl.
*H01L 21/04* (2006.01)
*H01L 21/02* (2006.01)
(Continued)

(52) U.S. Cl.
CPC .... *H01L 21/0485* (2013.01); *H01L 21/02068* (2013.01); *H10D 62/8325* (2025.01); *H10D 64/62* (2025.01)

(58) Field of Classification Search
CPC . H01L 21/0485; H01L 29/1608; H01L 29/45; H01L 21/02068; H01L 29/41716;
(Continued)

(56) References Cited

U.S. PATENT DOCUMENTS

2004/0043598 A1    3/2004  Park et al.
2009/0057906 A1    3/2009  Buchoff et al.

FOREIGN PATENT DOCUMENTS

CN    102859661 A    1/2013
CN    105518830 A    4/2016
(Continued)

OTHER PUBLICATIONS

English translation of JP2017168685 (Year: 2017).*
(Continued)

*Primary Examiner* — Tucker J Wright
(74) *Attorney, Agent, or Firm* — Murphy, Bilak & Homiller, PLLC

(57) ABSTRACT

A chip is provided. In an embodiment, the chip includes a silicon carbide substrate, a first sputtered metal layer on the silicon carbide substrate, and at least one second sputtered metal layer on the first sputtered metal layer. The first sputtered metal layer and the at least one second sputtered metal layer form an electrical contact. In another embodiment, the chip includes a silicon carbide substrate, a nickel-silicon layer on the silicon carbide substrate, and a layer sequence including a titanium layer, a nickel-containing layer, and a gold-tin or silver layer on the nickel-silicon layer.

20 Claims, 3 Drawing Sheets

Related U.S. Application Data continuation of application No. 16/422,373, filed on May 24, 2019, now Pat. No. 11,043,383.

(51) Int. Cl.
*H10D 62/832* (2025.01)
*H10D 64/62* (2025.01)

(58) Field of Classification Search
CPC ... H01L 29/417; H01L 21/283; H01L 23/485; H01L 21/321
See application file for complete search history.

(56) References Cited

FOREIGN PATENT DOCUMENTS

| | | |
|---|---|---|
| DE | 102006050360 A1 | 5/2008 |
| EP | 1796148 A2 | 6/2007 |
| JP | 2003243323 A | 8/2003 |
| JP | 2010016102 A | 1/2010 |
| JP | 2015103630 A | 6/2015 |
| JP | 2017168685 A | 9/2017 |
| WO | 2016113004 A1 | 7/2016 |

OTHER PUBLICATIONS

Crofton, J., et al., "The Physics of Ohmic Contacts to SiC", Physical Status Solidi B 202, 1997, 581-603.

Getto, R., et al., Characterization of sputtered titanium silicide ohmic contacts on n-type 6H-silicon carbide, 1999, 270-274.

Lu, Weijie, et al., "Carbon Structural Transitions and Ohmic Contacts on 4H-SiC", Journal of Electronic Materials, vol. 32, No. 5, 2003, 426-431.

Nikitina, I. P., et al., "Formation and role of graphite and nickel silicide in nickel based ohmic contacts to n-type silicon carbide", Journal of Applied Physics 97, 083709, 2005, 1-8.

Yang, S. J., et al., "Study of Co- and Ni-based ohmic contacts to n-type 4H-SiC", Diamond and Related Materials, vol. 13, 2004, 1149-1153.

\* cited by examiner

CHIP WITH A SILICON CARBIDE SUBSTRATE

TECHNICAL FIELD

Various examples of the invention relate to techniques associated with electrical contact connection of a silicon carbide (SiC) substrate. More particularly, various examples relate to techniques for rapidly and reliably producing a high-quality electrical contact on the SiC substrate.

BACKGROUND

Power semiconductor components have particular qualities in connection with the switching of high voltages and/or high currents. For that reason, power semiconductor components are used in various fields, for example in high-voltage DC transmission, for instance from offshore wind turbines, smart grid components, or in the driving of rail vehicles, etc.

Power semiconductor components are often formed in silicon carbide (SiC). SiC is a semiconductor material having a comparatively large bandgap. This promotes the particular qualities associated with the switching of high voltages and/or high currents.

A disadvantage of manufacturing techniques currently being used for SiC semiconductor components is the comparatively complex manufacture of the electrical contact connection. In order to provide robust electrical contact connection of the SiC substrate, complex process steps in accordance with reference implementations may be necessary. This can be costly and time-consuming.

SUMMARY

A process for producing an electrical contact with a first metal layer and at least a second metal layer on a silicon carbide substrate comprises the depositing of the first metal layer on the silicon carbide substrate and heat-treating of the first metal layer, which gives rise to a carbon residue. The process also comprises the performing of a chemical cleaning process to remove at least some of the carbon residue for cleaning of the first metal layer. The process also comprises the depositing of at least a second metal layer onto a surface of the cleaned first metal layer.

A chip comprises a silicon carbide substrate and a sputtered first metal layer on the silicon carbide substrate. The chip also comprises at least a sputtered second metal layer on the first metal layer, where the first metal layer and the at least a second metal layer form an electrical contact connection.

A chip comprises a silicon carbide substrate, a first metal layer on the silicon carbide substrate, and at least a second metal layer on the silicon carbide substrate. The first metal layer here may comprise a nickel-silicon layer, in which case the at least a second metal layer comprises a layer sequence comprising a titanium layer, a nickel-containing layer and a layer formed by gold and tin or by silver.

The features detailed above and features that are described hereinafter can be used not just in the corresponding combinations set out explicitly, but also in further combinations or in isolated form without leaving the scope of protection of the present invention.

BRIEF DESCRIPTION OF THE FIGURES

FIG. 3 giving an illustration of details of a chemical cleaning process according to various examples.

DETAILED DESCRIPTION

Figure 1:
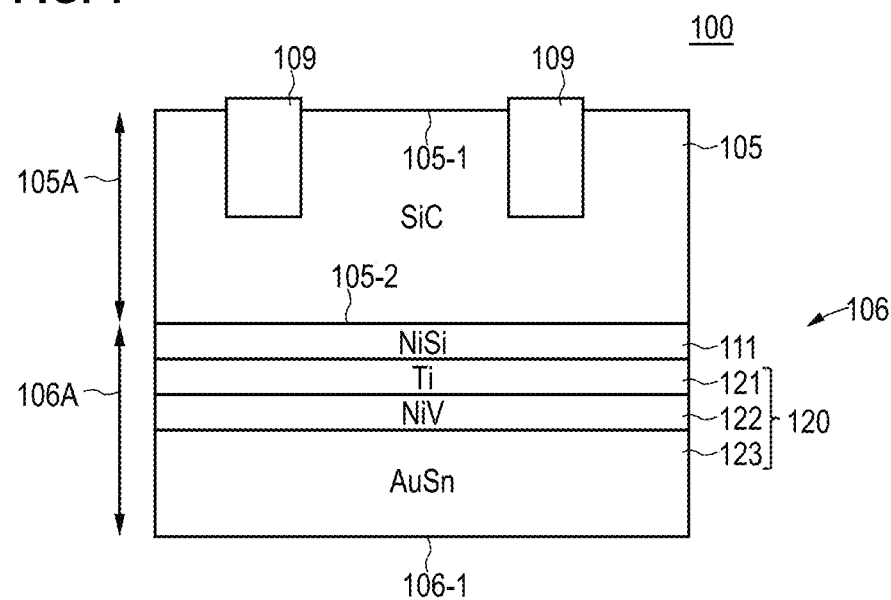
FIG. 1 is a schematic illustration of a chip with an SiC substrate and an electrical contact connection on the SiC substrate according to various examples.

The above-described properties, features and advantages of this invention and the manner in which they are achieved are elucidated in a clearer and more distinctly apparent manner in connection with the description of the working examples which follows, these being elucidated in detail in association with the drawings.

There follows a detailed elucidation of the present invention by working examples with reference to the drawings. In the figures, identical reference numerals denote identical or similar elements. The figures are schematic representations of different embodiments of the invention. Elements shown in the figures are not necessarily shown to scale. Instead, the different elements shown in the figures are reproduced such that their function and general purpose becomes apparent to the person skilled in the art.

There follows a description of techniques in association with the production of semiconductor components. Semiconductor components can be implemented with two terminals, for example in the form of diodes. Semiconductor components can also be implemented with three terminals, for example in the form of field-effect transistors, especially metal oxide field-effect transistors or bipolar transistors with an insulated gate electrode or barrier layer field-effect transistors or thyristors. Semiconductor components may also have more than three terminals. In the different examples described herein, the semiconductor components may be power semiconductor components. This means that the semiconductor component is capable of switching a particularly high voltage—for example at least 250 V or at least 600 V—and/or a particularly high current flow—for instance of more than 1 A.

A semiconductor component may be a chip (also called: semiconductor chip or semiconductor die), or the semiconductor component may be integrated on a chip. All features disclosed for a semiconductor component and/or for a process for producing a semiconductor component are thus also disclosed for a chip and/or for a process for producing a chip, and vice versa. For example, a chip is constructed exclusively from semiconductor material.

There follows a particular description of various examples associated with the processing of semiconductor material with a large bandgap, for example in order to produce the semiconductor components. The use of a large bandgap here refers generally to a semiconductor material having a bandgap of at least 2 eV, for example at least 2.5 eV. Such semiconductor materials with a large bandgap, for example SiC—for instance 4H—SiC in particular—or gallium nitride (GaN), have a large breakdown field strength of, for example, at least 2.5 MV/centimeter and high critical avalanche field strengths. For that reason, a greater dopant density in the semiconductor regions can be used compared to semiconductor materials with a smaller bandgap. This in turn results in a lower resistance in the conductive state.

There follows a discussion of various examples, primarily associated with SiC as semiconductor material, although corresponding techniques can in principle also be used for other kinds of semiconductor materials. SiC makes it possible to achieve particularly advantageous electrical characteristics for semiconductor components, especially power semiconductor components.

Various semiconductor components implemented by means of an SiC substrate (i.e., for example, formed in the SiC substrate and/or based, for example, on the SiC substrate) use electrical current flow through the substrate to an electrical contact. The electrical contact is often disposed on an opposite side of the substrate in relation to the corresponding semiconductor component. Typically, that side on which the at least one semiconductor component (for example functional areas, such as doping areas, of the at least one semiconductor component) is formed is referred to as the front side of the SiC substrate; and the opposite side as the back side. The front side in the case of 4H-SiC substrates is often referred to as the Si side, and the reverse side as C side. In this connection, an electrical contact disposed on the back side of the SiC substrate is also referred to as backside contact. In general, the techniques described herein can alternatively be used for formation of a front side contact. But what are described hereinafter, for reasons of simplicity, are primarily techniques in relation to backside contact connection; these techniques can also be used to implement frontside contact connection.

An electrical contact connection may comprise a large-area contact pad (for example of at least 250 µm×250 µm in size). The electrical contact connection may provide a low-resistance contact of the SiC substrate. More particularly, an electrical contact connection may comprise the first metal layer and the at least a second metal layer.

An example in which an electrical backside contact is used relates to the formation of a drain terminal of a metal oxide field-effect transistor as (power) semiconductor component or one of the two terminals of a diode as (power) semiconductor component.

In reference implementations, the production of an electrical contact on an SiC substrate is typically generated by means of nickel-base alloys. For example, a thin nickel-silicon metal layer—for example with 11% by weight of silicon—may be deposited on a surface of the SiC substrate. In order to form the electrical contact, the alloy may then be subjected to thermal treatment (heat treatment) in order to trigger a reaction with the SiC substrate: $SiC+2Ni \rightarrow Ni_2Si+C$. This is typically referred to as silicidation. For this purpose, a temperature of at least 950° C. is typically necessary. In some examples, laser-mediated thermal heating (laser thermal annealing; LTA) is used because this can avoid damage to semiconductor components.

Various implementations described herein of the process for producing the electrical contact are based on the finding that a by-product that can arise from such a heat treatment is carbon at the junction between SiC and nickel-silicon and/or at the surface of the unconverted nickel-silicon. The surface of the nickel-silicon here faces away from the SiC substrate. It has been recognized that such a carbon residue at the surface of the unconverted nickel-silicon can impair the mechanical properties of an electrical contact applied at a later stage. For example, it has been found that the adhesion of the at least a second metal layer on the nickel-silicon metal layer (especially the surface of the nickel-silicon metal layer) can be lowered by the carbon formed. However, it is possible that an ohmic contact at the junction between the SiC substrate and the nickel-silicon is improved by the carbon residue formed there.

In various examples, techniques are described for reliably removing such a residue of carbon at the surface in association with the production of an electrical contact on an SiC substrate. In this way, it is possible to provide an electrical contact with improved reliability, especially in connection with the mechanical properties, for example adhesion.

In the various techniques described herein, in detail, the electrical contact can be provided with particularly good properties. It is possible to establish high electrical conductivity, i.e. an ohmic contact. Moreover, it is possible to assure stable adhesion of corresponding metal layers of the electrical contact on the SiC substrate.

In addition, the electrical contact connection can transmit zero or only low tension to the SiC substrate. This can avoid deformations owing to mechanical tensions in connection with the semiconductor components as well.

Finally, the electrical contact connection may provide one or more contact pads which can provide a solder bond or a bond by wafer bonding. For example, in various applications, a chip with a semiconductor component may be mounted on a lead frame or within other modules by means of soldering processes. In this case, the contact pads should have electrical and mechanical properties which enable a reliable and stable solder bond.

In various examples, for this purpose, a first metal layer is first deposited on the SiC substrate, for example a nickel alloy and/or a nickel-containing layer. Then the first metal layer is heat-treated. This gives rise to the carbon residue, especially on a surface of the first metal layer remote from the SiC substrate. Subsequently, a chemical cleaning process is conducted, which removes at least some of the carbon residue by cleaning of the first metal layer. Then at least a second metal layer is deposited on a surface of the cleaned first metal layer.

The chemical cleaning process corresponds to a removal of the carbon residue by one or more chemical reactions. The chemical cleaning process may especially be delimited from a physical cleaning process in which—unlike in the chemical cleaning process—no chemical conversion of substances takes place. In a physical cleaning process, the cleaning is effected, for example, exclusively by mechanical effects.

The chemical cleaning process can particularly reliably and rapidly remove the carbon residue. In addition, the chemical cleaning process can have a high selectivity for the material to be removed, especially for the carbon residue. By comparison, it is possible in a physical cleaning process in the reference implementation that this leads to damage to the material of the first metallization beneath the carbon residue, which roughens it, for example. A chemical cleaning process can thus enable the provision of a smoother surface, for example.

For example, in reference implementations, physical cleaning processes, for example in situ bombardment with argon ions, are used prior to the deposition of the at least a second metal layer. It is possible that such a physical cleaning process has a low selectivity for the material to be removed. It is also possible that a cleaner surface can be achieved by means of a chemical cleaning process compared to a physical cleaning process.

Moreover, it is possible in some implementations that the physical cleaning process is conducted in a vacuum chamber used for the vapor deposition, i.e. in situ with a vapor deposition process, which suggests a downstream vapor deposition process. Vapor deposition is typically a batchwise process in which multiple wafers are processed simultaneously. Process faults during the vapor deposition operation therefore affect multiple wafers, which increases the cost risk. By contrast, sputtering deposition can be conducted as an individual process, i.e. for just a single wafer, which means that process faults can affect just the one wafer.

Correspondingly, the cost risk can be reduced in the case of use of pure sputtering deposition.

If further metallizations are to be applied by means of sputtering deposition to a vapor-deposited metallization, a plant changeover is typically required, and hence breakage of the vacuum. For example, this can lead to contamination and/or other adverse alteration of the exposed surfaces on which the sputtering deposition is to be conducted. Correspondingly, the mechanical stability of the bond between the metallization applied by means of sputtering deposition and the metallization applied by means of vapor deposition can be reduced—and hence the mechanical stability of the overall electrical contact connection.

Moreover, the performance of the physical cleaning process can be comparatively time-consuming, for example take a period of about 20 minutes in the case of typical implementations. This can make the production of the electrical contact connection costly. Moreover, after the performance of the physical cleaning process, another deposition of carbon can take place. All these disadvantages can be avoided by dispensing with the physical cleaning process or by using the chemical cleaning process.

There follows a particular description of the following examples:

In one example, a process for producing an electrical contact with a first metal layer and at least a second metal layer on a silicon carbide substrate is provided, wherein the process comprises: depositing the first metal layer on the silicon carbide substrate and heat-treating the first metal layer, which gives rise to a carbon residue, and conducting a chemical cleaning process to remove at least some of the carbon residue for cleaning of the first metal layer. The process also comprises the deposition of at least a second metal layer onto a surface of the cleaned first metal layer.

The chemical cleaning process can, for example, convert the carbon residue to the gas phase.

The chemical cleaning process may, for example, comprise the supply of oxygen plasma.

The chemical cleaning process may, for example, comprise chemical etching.

The chemical etching may, for example, be conducted with hydrofluoric acid.

It is possible that the depositing of the first metal layer comprises a first sputtering deposition.

It is possible that the depositing of the at least a second metal layer comprises at least a second sputtering deposition.

In some examples, multiple second metal layers can be deposited, where the depositing of multiple second metal layers is effected in situ.

In one example, a chip comprises a silicon carbide substrate and a sputtered first metal layer on the silicon carbide substrate. The chip also comprises at least a sputtered second metal layer on the first metal layer, wherein the first metal layer and the at least a second metal layer form electrical contact.

The at least a second metal layer may comprise, for example, one or more layers selected from the following group: a titanium layer; an aluminum layer; a nickel-containing layer (e.g. a nickel-vanadium layer or a nickel-silicon layer); a gold-tin layer; and a silver layer. The gold-tin layer and the silver layer may be alternatives to one another.

For all the working examples described here, it is possible that the gold-tin layer (or the silver layer) is replaced generally by a tin-containing layer. More particularly, a nickel-tin layer is conceivable.

It would be possible, for example, for the at least a second metal layer to comprise a buffer layer set up to buffer mechanical tensions within the second metal layer.

In one example, a chip comprises a silicon carbide substrate, a first metal layer on the silicon carbide substrate, and at least a second metal layer on the silicon carbide substrate. The first metal layer here may comprise a nickel-silicon layer. The at least a second metal layer may comprise a layer sequence. For example, the layer sequence is formed by a titanium layer and a nickel-containing layer. The layer sequence may also comprise a solderable layer, for example a gold-tin layer or a silver layer. More particularly, the layer sequence may comprise a titanium layer, a nickel-containing layer (e.g. a nickel-vanadium layer or a nickel-silicon layer) and a gold-tin layer. Alternatively, the layer sequence may comprise a titanium layer, a nickel-containing layer (e.g. a nickel-vanadium layer or a nickel-silicon layer) and a silver layer. A further titanium layer may be present between the nickel-containing layer and the silver layer. The layers of the layer sequence may be successive in the sequence specified.

Such chips can be produced, for example, by one of the processes described above.

FIG. 1 illustrates aspects in relation to a chip 100. The chip 100 comprises an SiC substrate 105 and an electrical contact 106 disposed on the SiC substrate 105.

The representation in FIG. 1 is not to scale. Typically, a thickness 105A of the SiC substrate 105—i.e. a vertical extent between a front side 105-1 and a back side 105-2 of the SiC substrate 105—is significantly greater than a thickness 106A of the electrical contact 106. For example, the thickness 105A of the SiC substrate 105 is typically in the range from 50 µm to 500 µm; while the thickness 106A of the electrical contact 106 is typically in the range from 1 µm to 20 µm.

FIG. 1 shows that electrical components 109 in the SiC substrate 105 are defined. It is often the case that, by means of the semiconductor components 109, a current flow between a frontside contact and the backside contact 106 can be controlled. In that case, the current flows through the SiC substrate 105.

In the example of FIG. 1, the electrical contact 106 comprises multiple metal layers. The electrical contact 106 especially comprises a first metal layer 111, implemented, for example, by a nickel-silicon layer. The electrical contact 106 also comprises multiple second metal layers 121-123, in the example of FIG. 1 implemented by a layer sequence 120. The layer sequence 120 may be on a side of the first metal layers 111 remote from the SiC substrate 105. The layer sequence 120 may have an upper second metal layer 121, a middle second metal layer 122 and a lower second metal layer 123.

The upper second metal layer 121 may directly adjoin the first metal layer 111. For example, the upper second metal layer 121 is formed by titanium. The upper second metal layer 121 may contain or be a titanium layer. On a side of the upper metal layer 121 remote from the SiC substrate 105 is the middle metal layer 122. The middle second metal layer 122 may have a single layer or multiple layers. For example, the middle second metal layer 122 comprises a nickel-containing layer (e.g. a nickel-vanadium layer or a nickel-silicon layer) or consists of a nickel-containing layer. In addition, the middle second metal layer 122 may have a titanium layer on a side of the middle second metal layer 122 remote from the upper second metal layer 121. The middle second metal layer 122 is followed by the lower second metal layer 123. The lower second metal layer 123 may directly adjoin the middle second metal layer 122. The lower second metal layer 123 may be an outer metal layer of the electrical contact 106. For example, the lower second metal layer 123 is freely accessible and/or solderable from the outside. The lower second metal layer 123 may include or consist of a tin-containing layer. For example, the lower second metal layer 123 comprises or is a gold-tin layer or a nickel-tin layer. Alternatively, the lower second metal layer 123 may be a silver layer or comprise a silver layer.

In some working examples, the upper second metal layer 121 is a titanium layer, the middle second metal layer 122 is a nickel-vanadium layer, and the lower second metal layer 123 is a gold-tin layer. In other working examples, the upper second metal layer 121 is a titanium layer, the middle second metal layer 122 is a layer stack of a nickel-vanadium layer and a titanium layer, and the lower second metal layer 123 is a silver layer. In both of the above working examples, it is possible to replace the nickel-vanadium layer with a nickel-silicon layer.

It has been found that such a design of the electrical contact 106 and especially of the layer sequence 120 has particular advantages in connection with the mechanical robustness of the electrical contact 106 and the ability of the electrical contact 106 to form a contact pad—for example for a solder contact or for wafer bonding. The contact pad may be formed, for example, by the surface 106-1.

Rather than pure electrical contact connection, the contact connection could also be provided by a contact that additionally or alternatively enables a mechanical bond (also referred to hereinafter as "mechanical bonding"). Examples of a mechanical bond are sintering or adhesive bonding.

On the other hand, it is possible in various examples to alter or modify the layer sequence 120. (i) For example, it would be possible to provide a further layer between the upper second metal layer 121 and the first metal layer 111, in order to buffer mechanical tensions. One example would be an aluminum layer. (ii) As a further example, rather than a titanium layer, it would also be possible to use an aluminum layer as the upper second metal layer 121. The provision of the titanium layer as the upper second metal layer 121 can provide good wetting of the entire area of the first metal layer 111. Corresponding properties may also be possessed by aluminum. (iii) In general, different alloys can be used as the lower second metal layer 123. A gold-tin layer has particularly good properties in connection with contact connection by soldering, especially diffusion soldering. Other material systems that have good soldering contact properties include, for example: nickel-tin, nickel-based alloys, for example nickel-silicon, nickel-vanadium, etc. (iv) A further optional layer could provide oxidation protection. Such a layer could be formed, for example, by silver (Ag) or consist of silver within the scope of manufacturing tolerances. All these examples (i)-(iv) may also be combined with one another or employed in isolation.

As a general rule, different techniques can be used for production of the chip 100 according to the example of FIG. 1. An illustrative process for production of the electrical contact 106 of the chip 100 is described in connection with FIG. 2.

Figure 2:
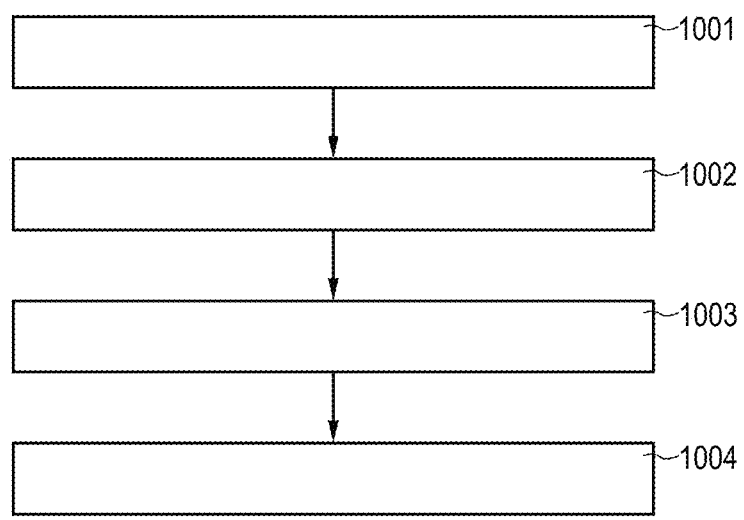
FIG. 2 is a flow diagram of an illustrative process.

FIG. 2 is a flow diagram of an illustrative process for production of an electrical contact on an SiC substrate. For example, the process according to FIG. 2 could be used to produce the electrical contact 106 on the SiC substrate 105 according to the example of FIG. 1.

First of all, in block 1001, a first metal layer 111—for example a nickel-silicon layer 111 in the example of FIG. 1—is deposited on the SiC substrate. For example, the first metal layer in block 1001 could be deposited on a front side or a back side of the SiC substrate.

Then, in block 1002, the first metal layer deposited is heat-treated. Different techniques for heat treatment, i.e. of thermal activation for chemical conversion of the first metal layer, can be effected here. Examples include LTA (laser thermal anneal) and rapid thermal annealing.

Then, in block 1003, a chemical cleaning process is conducted. The chemical cleaning process serves to at least partly remove residues that arise as a result of the heat treatment from block 1002. For example, the carbon residues may be removed completely (i.e. completely within the scope of measurement accuracies). More particularly, a carbon residue that arises from the heat treatment of the first metal layer present on the SiC substrate may be wholly or partly removed by the performance of the chemical cleaning process in block 1003, which results in cleaning of the first metal layer.

After the performance of the chemical cleaning process, subsequently, in block 1004, at least a second metal layer is deposited. For example, in block 1004, it would be possible to deposit the layer sequence 120 comprising the titanium layer 121, the nickel-vanadium layer 122 and the gold-tin layer 123 according to the example of FIG. 1.

There follows a discussion of various details in connection with the possible implementation of various process steps 1001-1004 in the process from FIG. 2. These examples are especially elucidated in connection with the use of the process from FIG. 2 for production of the electrical contact 106 of the chip 100 from the example of FIG. 1, and corresponding techniques may generally also be used in connection with other implementations of the electrical contact connection.

In the various examples described herein, different techniques are possible to deposit the first metal layer in block 1001 or to deposit the at least a second metal layer in block 1004. Techniques that can be employed in connection with the deposition of metal layers in the various examples described herein include: vapor deposition, for example by thermal heating of a crucible or by use of a heating electron beam; and sputtering.

In a sputtering deposition, atoms are knocked out of a reservoir of the metal to be deposited (target) by bombardment with ions, for example noble gas ions. The atoms are converted to the gas phase and are then deposited on the surface to be coated. The reservoir here forms the cathode toward which the ions are accelerated by an acceleration voltage. The acceleration voltage and the ambient pressure define critical process parameters. It is also possible that the sputtering deposition has a characteristic nano-/microstructure by comparison with thermal vapor deposition. For example, the porosity, i.e. the density of pores, the pore size and/or the pore arrangement, may be characteristic. More particularly, it is possible that the sputtering deposition forms characteristic crystallites, i.e. with specific size, shape and/or orientation. The grain size may be characteristic. A characteristic texture is achievable. A metal layer deposited by means of sputtering deposition may thus especially be distinguished by the crystal growth in the metal layer from a metal layer applied by means of other methods, for example by means of vapor deposition.

More particularly, it is possible in the various examples described herein that both the first metal layer in block 1001, i.e. especially the nickel-silicon layer 111, and also the at least a second metal layer in block 1004, i.e. especially the layer sequence 120, may each be produced by a corresponding sputtering deposition.

More particularly, in block 1004, multiple second metal layers may be deposited, which may differ in their materials. The second metal layers together may form an electrical contact. The second metal layers in block 1004 may be deposited in situ, i.e. without intermediate loss or breakage of the vacuum. For example, it is possible that, in the case of in situ processing, the pressure in the process chamber between the performance of the two process steps 1003 and 1004 is not greater than 1 mbar at any time. The in situ processing can be conducted, for example, in the same process chamber.

The avoidance of a breakage of the vacuum during the deposition of the second metal layers in process step 1004 can reduce the risk of contamination of the electrical contact 106. It has also been observed that the avoidance of the breakage of the vacuum can improve the reliability of contact connection by soldering or wafer bonding of the electrical contact 106. For example, the use of an oxidation protection layer, for example of platinum or another precious metal, can be avoided; in this way, it is in turn possible to improve structural integrity and strength, which can be particularly important in connection with the ability to produce a solder bond.

Owing to the cleaning process used, it may additionally be possible to dispense with vapor deposition processes. Typically, vapor deposition processes are associated with the manual handling of the corresponding chip 100, which entails a risk of fracture, contamination or damage. Such disadvantages can be avoided by the sputtering.

In addition, sputtering deposition—owing to the reduced process time—can be conducted on individual wafers. By contrast, vapor deposition processes are usually conducted in batchwise process. In the event of a fault, it is possible to reduce rejects in the case of processing of single wafers, and consequently the costs that arise.

It has also been observed that a gold-tin layer, for example, can be provided particularly efficiently and reliably by sputtering deposition. This generally requires a clean surface, which can be assured by means of a chemical cleaning process described here. More particularly, it may be advantageous for good adhesion of a gold-tin layer deposited by means of sputtering deposition when preceding layers have likewise been deposited by means of sputtering deposition, such that no breakage of the vacuum is required between individual process steps.

As a general rule, different techniques can also be used in connection with the chemical cleaning process in process step 1003. An illustrative implementation of process step 1003 is shown in the process of FIG. 3.

Figure 3:
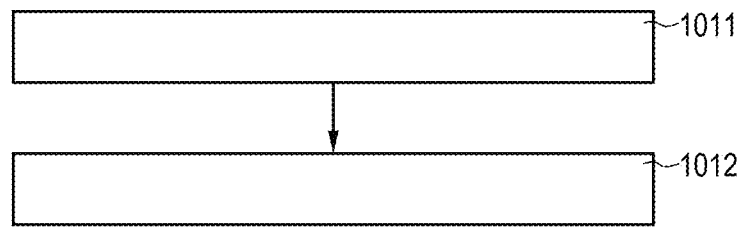
FIG. 3 is a flow diagram of an illustrative process.

FIG. 3 is a flow diagram of an illustrative process. FIG. 3 shows that a two-stage chemical cleaning process can be used.

First of all, in process step 1011, an oxygen plasma can be supplied. The effect of the supplying of the oxygen plasma may be that at least some of the carbon residue is converted to the gas phase. The carbon residue can then be pumped away. At the same time, an oxide residue can be formed by the oxygen plasma. In process step 1012, a chemical cleaning process may comprise chemical etching in order to remove the oxide residue. For example, the chemical etching can be conducted with hydrofluoric acid or sulfuric acid. Details of such an illustrative implementation of the chemical cleaning process 300 are also shown in the schematic diagram of FIG. 4.

Figure 4:
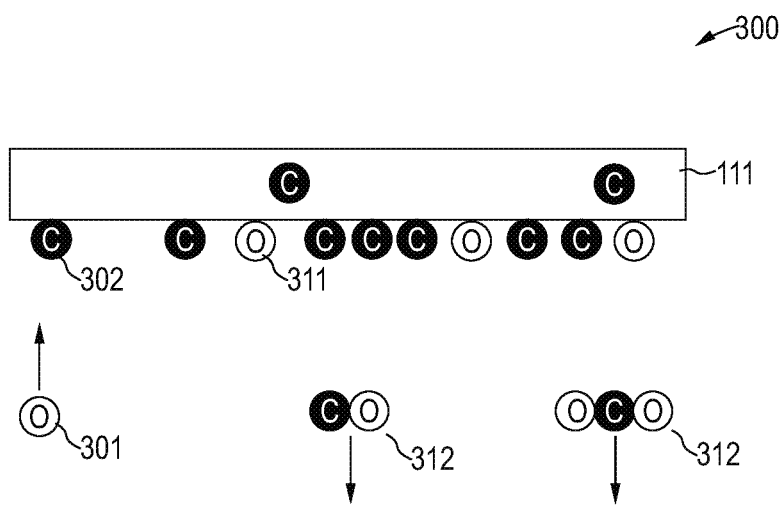
FIG. 4 is a schematic illustration of details of a chemical cleaning process according to various examples.

FIG. 4 illustrates, by way of example, aspects in connection with the chemical cleaning process 300. FIG. 4 shows that carbon residues 302 may be present on a surface of the metal layer 111 and also partly—as a result of diffusion—within the metal layer 111. The chemical cleaning process 300 in that case comprises the supply of an oxygen plasma 301. In this way, the carbon residue 302 is converted to the gas phase 312, illustrated here by formation of carbon monoxide and carbon dioxide. An oxide 311 forms on the surface of the metal layer 111, which can in turn be removed by chemical etching, for instance with hydrofluoric acid (not shown in FIG. 4).

The oxygen plasma may be generated by employing different techniques. For example, the corresponding free radicals can be generated in a reactor, for instance by a microwave generator. In this case, the use of the oxygen plasma 301 for conversion of the carbon residue 302 to the gas phase 312 is merely illustrative. In other examples, it is also possible to use other techniques for conversion of the carbon residue 302 to the gas phase 312, for example using hydrogen. As a general rule, rather than oxygen plasma, it is also possible to use another kind of free radicals. One example would be a nitrogen oxide plasma.

The chemical etching can be implemented in various ways. For example, hydrofluoric acid treatment could be effected by dipping, etching on a turntable, vapor treatment, etc.

Such a chemical cleaning process 300 has advantages especially by comparison with reference implementations with a physical cleaning process using argon bombardment. More particularly, damage to the structure of the metal layer 111 can be avoided.

In summary, there has been a description above of techniques that enable removal of carbon residues on a metal layer that has been applied to an SiC substrate. This can be effected by a chemical cleaning process. In this way, it is possible to convert the carbon residue to the gas phase, such that the carbon residue present in the gas phase can be removed from the reaction environment. Redeposition of the carbon residue can be avoided. This achieves electrical contact connection without significant proportions of a carbon residue. In various examples, it is possible to remove an accompanying product from the chemical cleaning process, for example an oxide layer, for instance by chemical etching by means of hydrofluoric acid.

By such techniques, it is possible to apply an outer layer of the electrical contacts—for example a gold-tin layer—to a wetting layer by sputtering, where the sputtering can especially be effected in situ. The in situ processing enables a considerable reduction in the contamination of the electrical contact, which in turn enables improved mechanical adhesion of the electrical contact on the SiC substrate and/or the individual layers of the electrical contact to one another.

By means of the techniques described herein, it is also possible to achieve a reduction in costs, because the time taken for processing can be lowered.

It is of course possible to combine the features of the above-described embodiments and aspects of the invention with one another. More particularly, the features may be used not only in the combinations described but also in other combinations or on their own without leaving the scope of the invention.

For example, the techniques described herein can be used for production of the electrical contact both on a front side of the SiC substrate and on a back side of the SiC substrate.

For example, there has been a description above of techniques for providing a particular layer sequence comprising a titanium layer, a nickel-vanadium layer and a gold-tin layer. Rather than such an implementation, it is also possible to provide other layer sequences on the cleaned nickel-silicon layer. For example, it would also be possible to use aluminum or platinum rather than titanium. Aluminum could also be provided in addition to the titanium layer in order to enable absorption of tensions. A platinum layer can be provided as oxidation protection in order to enable ex situ deposition of the gold-tin layer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A chip, comprising:
   a silicon carbide substrate;
   a first sputtered metal layer on the silicon carbide substrate; and
   at least one second sputtered metal layer on the first sputtered metal layer,
   wherein the first sputtered metal layer and the at least one second sputtered metal layer form an electrical contact,
   wherein the first sputtered metal layer is a nickel-silicon layer.

2. The chip of claim 1, wherein the at least one second sputtered metal layer comprises one or more layers selected from the group consisting of: a titanium layer; an aluminum layer; a nickel-silicon layer; a nickel-vanadium layer; and a gold-tin layer.

3. The chip of claim 1, wherein the at least one second sputtered metal layer comprises one or more layers selected from the group consisting of: a titanium layer; an aluminum layer; a nickel-containing layer; and a silver layer.

4. The chip of claim 1, wherein the at least one second sputtered metal layer comprises a buffer layer configured to buffer mechanical tensions within the at least one second sputtered metal layer.

5. The chip of claim 1, wherein the at least one second sputtered metal layer comprises a layer sequence.

6. The chip of claim 5, wherein the layer sequence comprises a titanium layer and a nickel-containing layer.

7. The chip of claim 6, wherein the layer sequence further comprises a solderable layer.

8. The chip of claim 7, wherein the solderable layer is a gold-tin layer or a silver layer.

9. The chip of claim 5, wherein the layer sequence comprises a titanium layer, a nickel-containing layer, and a gold-tin layer.

10. The chip of claim 9, wherein the nickel-containing layer is a nickel-vanadium layer or a nickel-silicon layer.

11. The chip of claim 5, wherein the layer sequence comprises a titanium layer, a nickel-containing layer, and a silver layer.

12. The chip of claim 11, wherein the nickel-containing layer is a nickel-vanadium layer or a nickel-silicon layer.

13. The chip of claim 11, wherein the layer sequence further comprises a further titanium layer between the nickel-containing layer and the silver layer.

14. The chip of claim 5, wherein the layer sequence is on a side of the first sputtered metal layer remote from the silicon carbide substrate, and wherein the layer sequence comprises an upper second metal layer, a middle second metal layer, and a lower second metal layer.

15. The chip of claim 14, wherein the upper second metal layer directly adjoins the first sputtered metal layer, wherein the middle second metal layer directly adjoins a side of the upper metal layer remote from the silicon carbide substrate, and wherein the lower second metal layer is an outer metal layer of the electrical contact.

16. The chip of claim 15, wherein the middle second metal layer comprises a nickel-containing layer and a titanium layer on a side of the nickel-containing layer remote from the upper second metal layer.

17. The chip of claim 15, wherein the lower second metal layer directly adjoins the middle second metal layer.

18. The chip of claim 1, wherein a plurality of semiconductor components formed in the silicon carbide substrate control a current flow between a contact at a frontside of the silicon carbide substrate and the electrical contact at a backside of the silicon carbide substrate.

19. A chip, comprising:
    a silicon carbide substrate;
    a nickel-silicon layer on the silicon carbide substrate; and
    a layer sequence comprising a titanium layer, a nickel-containing layer, and a gold-tin or silver layer on the nickel-silicon layer.

20. A chip, comprising:
    a silicon carbide substrate;
    a first sputtered metal layer on the silicon carbide substrate; and
    at least one second sputtered metal layer on the first sputtered metal layer,
    wherein the first sputtered metal layer and the at least one second sputtered metal layer form an electrical contact,
    wherein a plurality of semiconductor components formed in the silicon carbide substrate control a current flow between a contact at a frontside of the silicon carbide substrate and the electrical contact at a backside of the silicon carbide substrate.

* * * * *